(12) United States Patent
Kim et al.

(10) Patent No.: US 8,614,476 B2
(45) Date of Patent: Dec. 24, 2013

(54) NONVOLATILE MEMORY DEVICES AND FABRICATING METHODS THEREOF

(75) Inventors: Hong-Suk Kim, Yongin-si (KR); Yong-Seok Kim, Yongin-si (KR); Hun-Hyeong Lim, Hwaseong-si (KR); Ki-Hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/564,992

(22) Filed: Aug. 2, 2012

(65) Prior Publication Data

US 2013/0105880 A1 May 2, 2013

(30) Foreign Application Priority Data

Oct. 27, 2011 (KR) ........................ 10-2011-0110672

(51) Int. Cl.
*H01L 29/788* (2006.01)
(52) U.S. Cl.
USPC ............... 257/316; 257/640; 257/E29.304
(58) Field of Classification Search
USPC ......................................... 257/325, 637, 640
See application file for complete search history.

(56) References Cited

U.S. PATENT DOCUMENTS

| 5,729,035 | A  | * | 3/1998 | Anma .......................... 257/324 |
| 7,001,810 | B2 | * | 2/2006 | Dong et al. .................. 438/261 |
| 7,414,285 | B2 | * | 8/2008 | Akahori et al. .............. 257/321 |

FOREIGN PATENT DOCUMENTS

| JP | 2004047614 A | 2/2004 |
| JP | 2006339599 A | 12/2006 |
| KR | 20100125686 A | 12/2010 |
| KR | 20100127154 A | 12/2010 |

* cited by examiner

*Primary Examiner* — Chandra Chaudhari
(74) *Attorney, Agent, or Firm* — Harness, Dickey & Pierce, P.L.C.

(57) ABSTRACT

Non-volatile memory devices, and fabricating methods thereof, include a floating gate over a substrate, a lower barrier layer including a first lower barrier layer on the upper surface of the floating gate, and a second lower barrier layer on a side surface of the floating gate to have a thickness smaller than a thickness of the first lower barrier layer, an inter-gate dielectric layer over the lower barrier layer, and a control gate over the inter-gate dielectric layer.

20 Claims, 20 Drawing Sheets $T_1 > T_2$ $T_1 > T_2$
$T_3 > T_4$ $T_1 > T_2$ $T_1 > T_2$ $T_3 > T_4$ $T_1 > T_2$ $T_1 > T_2$

NONVOLATILE MEMORY DEVICES AND FABRICATING METHODS THEREOF

CROSS-REFERENCE TO RELATED APPLICATION

This application claims priority from Korean Patent Application No. 10-2011-0110672 filed on Oct. 27, 2011 in the Korean Intellectual Property Office, and all the benefits accruing therefrom under 35 U.S.C. §119, the contents of which are herein incorporated by reference in their entirety.

BACKGROUND

1. Field

Example embodiments relate to nonvolatile memory devices and/or fabricating methods thereof.

2. Description of the Related Art

Semiconductor memory devices are generally classified into volatile memory devices and nonvolatile memory devices.

The volatile memory devices are memory devices in which stored data are extinguished (or, loss) when power supply is interrupted. The volatile memory devices include a static random access memory (SRAM), a dynamic RAM (DRAM), a synchronous DRAM (SDRAM) and the like.

The nonvolatile memory devices are memory devices in which stored data are maintained even though power supply is interrupted. The nonvolatile memory devices include a read only memory (ROM), a programmable ROM (PROM), an erasable programmable ROM (EPROM), an electrically erasable programmable ROM (EEPROM), a flash memory device, a nonvolatile memory device using a resistance material (e.g., a phase-change RAM (PRAM)), a ferroelectric RAM (FRAM), a resistive RAM (RRAM), a magnetic RAM (MRAM) and the like.

Recently, with the miniaturization and integration of the nonvolatile memory device, an aspect ratio of a floating gate tends to increase. Accordingly, an electric field is concentrated on an upper portion of the floating gate, thereby causing a problem with the reliability and operation of the device.

SUMMARY

Example embodiments relate to nonvolatile memory devices and/or fabricating methods thereof.

An example embodiment provides a nonvolatile memory device with improved reliability and operation characteristics.

Another example embodiment provides a fabricating method of a nonvolatile memory device with improved reliability and operation characteristics.

According to yet another example embodiment, there is provided a nonvolatile memory device including a floating gate over a substrate; and a lower barrier layer including a first lower barrier layer on an upper surface of the floating gate, and a second lower barrier layer on a side surface of the floating gate. The second lower barrier layer has a thickness smaller than a thickness of the first lower barrier layer. The nonvolatile memory device further includes an inter-gate dielectric layer over the lower barrier layer; and a control gate over the inter-gate dielectric layer.

The upper surface of the floating gate and the side surface of the floating gate may be in contact with each other at a rounded edge. The first lower barrier layer and the second lower barrier layer may be in contact with each other at an edge of the lower barrier layer, and the edge of the lower barrier layer may be rounded along a profile of the floating gate.

The inter-gate dielectric layer may include an upper surface and a side surface formed along a profile of the floating gate.

The nonvolatile memory device may further include an upper barrier layer including a first upper barrier layer on the upper surface of the inter-gate dielectric layer, and a second upper barrier layer on the side surface of the inter-gate dielectric layer. A thickness of the first upper barrier layer may be larger than a thickness of the second upper barrier layer. The upper barrier layer may include silicon nitride.

The inter-gate dielectric layer may include a first oxide layer, a nitride layer and a second oxide layer sequentially stacked.

The nonvolatile memory device may further include a tunneling insulating layer below the floating gate.

The lower barrier layer may include silicon nitride. The lower barrier layer may surround the floating gate.

A thickness of the second lower barrier layer may decrease towards the substrate.

The substrate may include active regions defined by a device isolation layer, and the floating gate and the lower barrier layer may be over the active regions.

According to still another example embodiment, there is provided a nonvolatile memory device, including a floating gate over a substrate; an inter-gate dielectric layer over the floating gate and along a profile of the floating gate; an upper barrier layer including a first upper barrier layer on an upper surface of the inter-gate dielectric, and a second upper barrier layer on a side surface of the inter-gate dielectric. The second upper barrier layer has a thickness smaller than a thickness of the first upper barrier layer. The nonvolatile memory device further includes a control gate over the upper barrier layer.

The upper barrier layer is formed of silicon nitride. The upper barrier layer may be formed of implanted nitrogen ions.

According to a further example embodiment, there is provided a nonvolatile memory device, including a floating gate over a substrate; a first diffusion prevention layer formed along a profile of the floating gate. The first diffusion prevention layer formed along side surfaces of the floating gate are thinner than the first diffusion prevention layer formed along an upper surface of the floating gate. The nonvolatile memory device further includes an inter-gate dielectric layer over the floating gate; and a control gate over the inter-gate dielectric layer.

The first diffusion prevention layer may be interposed between the floating gate and the inter-gate dielectric layer, or between the inter-gate dielectric layer and the control gate.

The nonvolatile memory device may further include a second diffusion prevention layer interposed between the control gate and the inter-gate dielectric layer. The second diffusion prevention layer may be formed along the profile of the floating gate such that the second diffusion prevention layer formed along the side surfaces of the floating gate are thinner than the second diffusion prevention layer formed along the upper surface of the floating gate. The first diffusion prevention layer may be interposed between the floating gate and the inter-gate dielectric layer.

The first diffusion prevention layer formed along the side surfaces of the floating gate may be tapered.

Edges of the upper surface of the floating gate and edges of an upper surface of the first diffusion prevention layer may be rounded.

The example embodiments are not limited thereto, and the other example embodiments will be described in or be apparent from the following description of the embodiments.

BRIEF DESCRIPTION OF THE DRAWINGS

Example embodiments will be more clearly understood from the following detailed description taken in conjunction with the accompanying drawings.

FIG. 1 is a cross-sectional view showing a nonvolatile memory device in accordance with an example embodiment;

FIG. 2 is a partial enlarged view of portion A of FIG. 1;

FIG. 3 is a cross-sectional view showing a nonvolatile memory device in accordance with another example embodiment;

FIG. 4 is a cross-sectional view showing a nonvolatile memory device in accordance with still another example embodiment;

DETAILED DESCRIPTION OF EXAMPLE EMBODIMENTS

Figure 1:
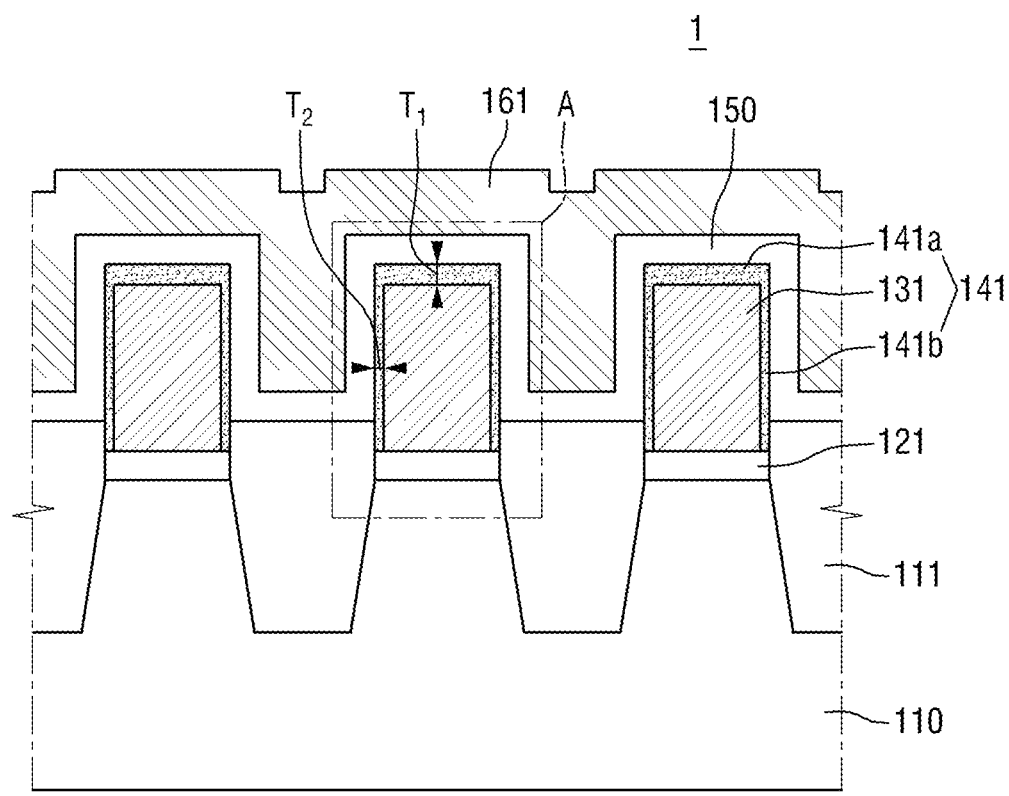
FIGS. 1-4 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to nonvolatile memory devices and/or fabricating methods thereof.

Hereinafter, a nonvolatile memory device in accordance with an example embodiment will be described with reference to FIGS. 1 and 2.

FIG. 1 is a cross-sectional view showing a nonvolatile memory device in accordance with an example embodiment. FIG. 2 is a partial enlarged view of portion A of FIG. 1.

Referring to FIG. 1, a nonvolatile memory device 1 in accordance with the present example embodiment includes a substrate 110, a tunneling insulating layer 121, a floating gate 131, a lower barrier layer 141, an inter-gate dielectric layer 150, and a control gate 161.

The substrate 110 may be a substrate formed of at least one semiconductor material selected from the group consisting of Si, Ge, SiGe, GaP, GaAs, SiC, SiGeC, InAs, InP and the like, a quartz substrate, a glass substrate for display, a semiconductor on insulator (SOI) substrate, or the like, but it is not limited thereto. The substrate 110 may include a device isolation layer 111 defining active regions (AR in FIG. 10). The device isolation layer 111 may be, e.g., a field oxide (FOX) layer using shallow trench isolation (STI) or a local oxidation of silicon (LOCOS) method. The surface of the device isolation layer 111 is formed at a higher level (or, alternatively, height) than the surface of the substrate 110. Further, a plurality of wells (not shown) may be formed in the substrate 110 to optimize the characteristics of transistors formed on the substrate 110.

The tunneling insulating layer 121 is formed on the active regions of the substrate 110. The surface of the tunneling insulating layer 121 may be formed at lower than the surface of the device isolation layer 111. The tunneling insulating layer 121 may include a material appropriate for tunneling of electrons (e.g., an oxide layer, a nitride layer or a high dielectric constant layer). Specifically, the tunneling insulating layer 121 may be a single layer or combination layer formed using at least one of $SiO_2$, $Hf_xO_y$, $Al_xO_y$, $Zr_xO_y$, $Ta_xO_y$, $Hf_xSi_{1-x}O_y$, $Hf_xSi_{1-x}O_yN_z$ and the like, but it is not limited thereto. The tunneling insulating layer 121 may have a thickness of about 30 Å to 100 Å.

The floating gate 131 serves to store charges which determine a logic state of the nonvolatile memory device. The floating gate 131 is formed on the tunneling insulating layer 121 along a sidewall of the device isolation layer 111. The surface of the floating gate 131 may be formed at a higher level (or, alternatively, height) than the surface of the device isolation layer 111. The floating gate 131 may be formed of, e.g., polysilicon doped with semiconductor impurities such as phosphorus. The floating gate 131 may have a thickness of about 1000 Å to about 3000 Å, but it is not limited thereto. The floating gate 131 may have a box shape including upper and side surfaces.

The lower barrier layer 141 is formed along a profile of the floating gate 131. The lower barrier layer 141 includes a first lower barrier layer 141a formed on the upper surface of the floating gate 131, and a second lower barrier layer 141b formed on the side surface of the floating gate 131. A thickness $T_1$ of the first lower barrier layer 141a may be larger than a thickness $T_2$ of the second lower barrier layer 141b. In a case where the first lower barrier layer 141a formed on the upper surface of the floating gate 131 is formed to have a thickness larger than a thickness of the second lower barrier layer 141b formed on the side surface of the floating gate 131, it is possible to mitigate the electric field concentrated on an upper portion of the floating gate 131, thereby improving reliability and operation characteristics of the nonvolatile memory device. Further, it is possible to prevent leakage current due to the electric field concentrated on the upper portion.

Figure 2:
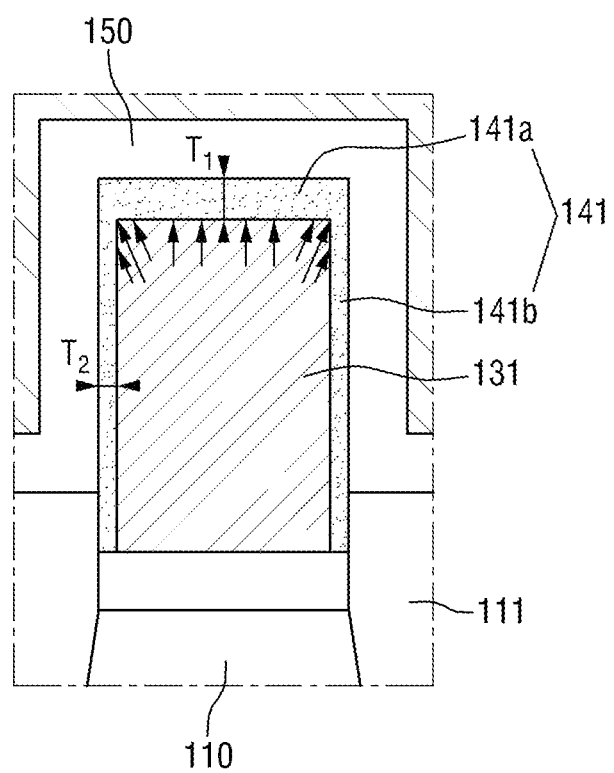

Referring to FIG. 2, in a case where the floating gate 131 has a box shape including the upper and side surfaces, the electric field may be concentrated on an edge portion where the upper and side surfaces meet each other. Further, in a case where an aspect ratio of the floating gate is large, the electric field concentration on the upper surface of the floating gate becomes more intense. However, as in the present example embodiment, in a case where the thickness $T_1$ of the first lower barrier layer 141a formed on the upper surface of the floating gate 131 is larger than the thickness $T_2$ of the second lower barrier layer 141b, it is possible to mitigate the electric field concentrated on the edge and upper surface of the floating gate 131, thereby improving reliability and operation characteristics of the device. Specifically, the thickness $T_1$ of the first lower barrier layer 141a may be more than twice larger than the thickness $T_2$ of the second lower barrier layer 141b. In a case where the thickness $T_1$ of the first lower barrier layer 141a is more than twice larger than the thickness $T_2$ of the second lower barrier layer 141b, it is possible to effectively mitigate the electric field concentration on the edge and upper surface of the floating gate 131.

The lower barrier layer 141 may be formed on the active regions defined by the device isolation layer 111 without being formed on the device isolation layer 111. If the lower barrier layer 141 is also formed on the device isolation layer 111, charge loss may occur.

The lower barrier layer 141 may include the first lower barrier layer 141a and the second lower barrier layer 141b connected to each other so as to surround the floating gate 131. FIG. 1 illustrates a case where the second lower barrier layer 141b is in contact with the sidewall of the device isolation layer 111 while surrounding the floating gate 131. Although not shown in the drawing, the floating gate 131 may be formed to be in contact with the sidewall of the device isolation layer 111 and the second lower barrier layer 141b may be formed to surround (or, alternatively on) the sidewall of the floating gate 131 in contact with the device isolation layer 111.

The first lower barrier layer 141a and the second lower barrier layer 141b constituting the lower barrier layer 141 may be formed of the same material, particularly, silicon nitride. The first lower barrier layer 141a and the second lower barrier layer 141b constituting the lower barrier layer 141 may be integrally formed. Further, the lower barrier layer 141 may be formed using a plasma nitridation process. The lower barrier layer 141 also serves to prevent diffusion of the impurities doped into the floating gate 131.

The inter-gate dielectric layer 150 may be formed on the lower barrier layer 141, and may be a single layer of an oxide layer or nitride layer, a laminated layer of oxide and nitride layers, or a mixed layer thereof. For example, a laminated layer (ONO layer) of a lower oxide layer, a nitride layer and an upper oxide layer may be mainly used as the inter-gate dielectric layer 150. The lower oxide layer may have a thickness of about 100 Å, the nitride layer may have a thickness of about 100 Å, and the upper oxide layer may have a thickness of about 40 Å, but example embodiments are not limited thereto. The inter-gate dielectric layer 150 may be formed along the profile of the floating gate 131 and the lower barrier layer 141. Accordingly, the inter-gate dielectric layer 150 may have a structure including an upper surface formed on the upper surfaces of the first lower barrier layer 141a and the device isolation layer 111, and a side surface formed on the second lower barrier layer 141b.

The control gate 161 is formed on the inter-gate dielectric layer 150, and although not shown in the drawing, a capping layer may be further formed on the upper surface of the control gate 161. The nonvolatile memory device 1 in accordance with the present example embodiment may store data while a voltage applied to the control gate 161 is coupled with the floating gate 131. The control gate 161 may be formed of polysilicon, metal, metal silicide, a metal nitride layer or the like. The metal nitride layer may include TiN or TaN, but it is not limited thereto.

Hereinafter, a nonvolatile memory device in accordance with another example embodiment will be described with reference to FIG. 3.

Figure 3:
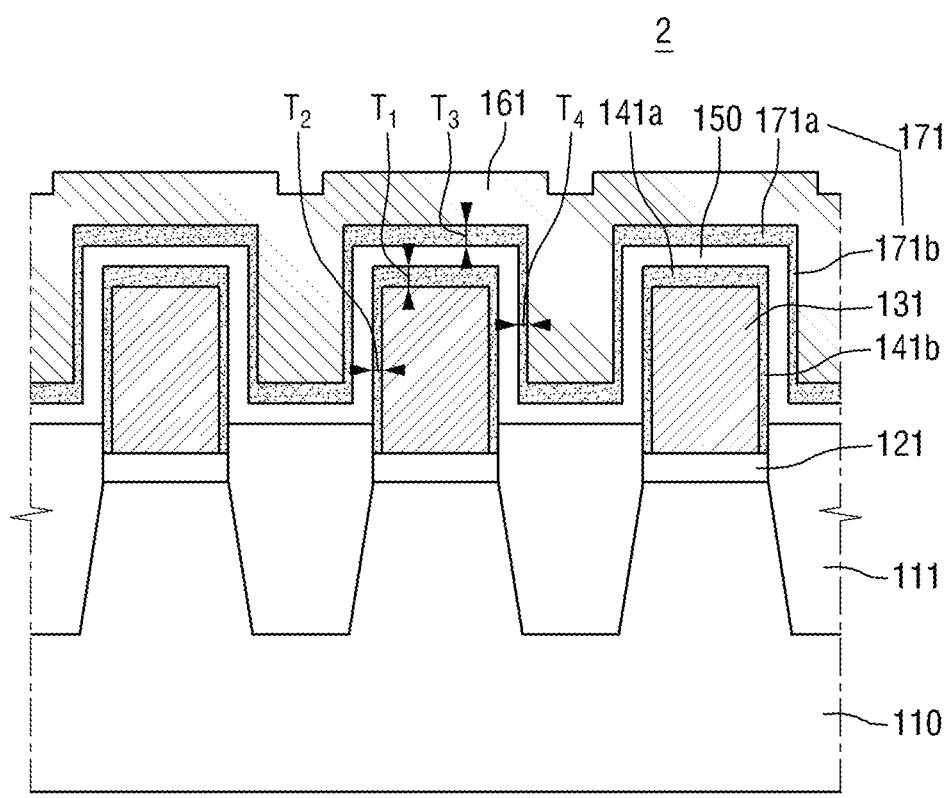

FIG. 3 is a cross-sectional view showing a nonvolatile memory device in accordance with another example embodiment.

Referring to FIG. 3, a nonvolatile memory device 2 according to the present example embodiment is different from the nonvolatile memory device 1 in the above-described example embodiment in that the nonvolatile memory device 2 further includes an upper barrier layer 171 formed on the inter-gate dielectric layer 150. The following description will be made focusing on substantial differences from the nonvolatile memory device 1.

The upper barrier layer 171 is formed on the inter-gate dielectric layer 150, and formed along a profile of the inter-gate dielectric layer 150. Accordingly, the upper barrier layer 171 includes a first upper barrier layer 171a formed on the upper surface of the inter-gate dielectric layer 150, and a second upper barrier layer 171b formed on the side surface of the inter-gate dielectric layer 150. In this case, a thickness $T_3$ of the first upper barrier layer 171a may be larger than a thickness $T_4$ of the second upper barrier layer 171b. Specifically, the thickness $T_3$ may be more than twice larger than the thickness $T_4$.

As described above, the electric field concentration on the edge and upper surface of the floating gate may cause a reduction of reliability and operation characteristics of the memory device. However, in a case where the upper barrier layer 171 is formed together with the lower barrier layer 141, it is possible to more effectively mitigate the electric field concentration, thereby improving reliability and operation characteristics of the device. Further, the upper barrier layer 171 may serve to prevent diffusion of impurities and protect the floating gate 131 in a subsequent step.

The upper barrier layer 171 may be formed of silicon nitride using a plasma nitridation method.

Hereinafter, a nonvolatile memory device in accordance with still another example embodiment will be described with reference to FIGS. 4 and 5.

Figure 4:
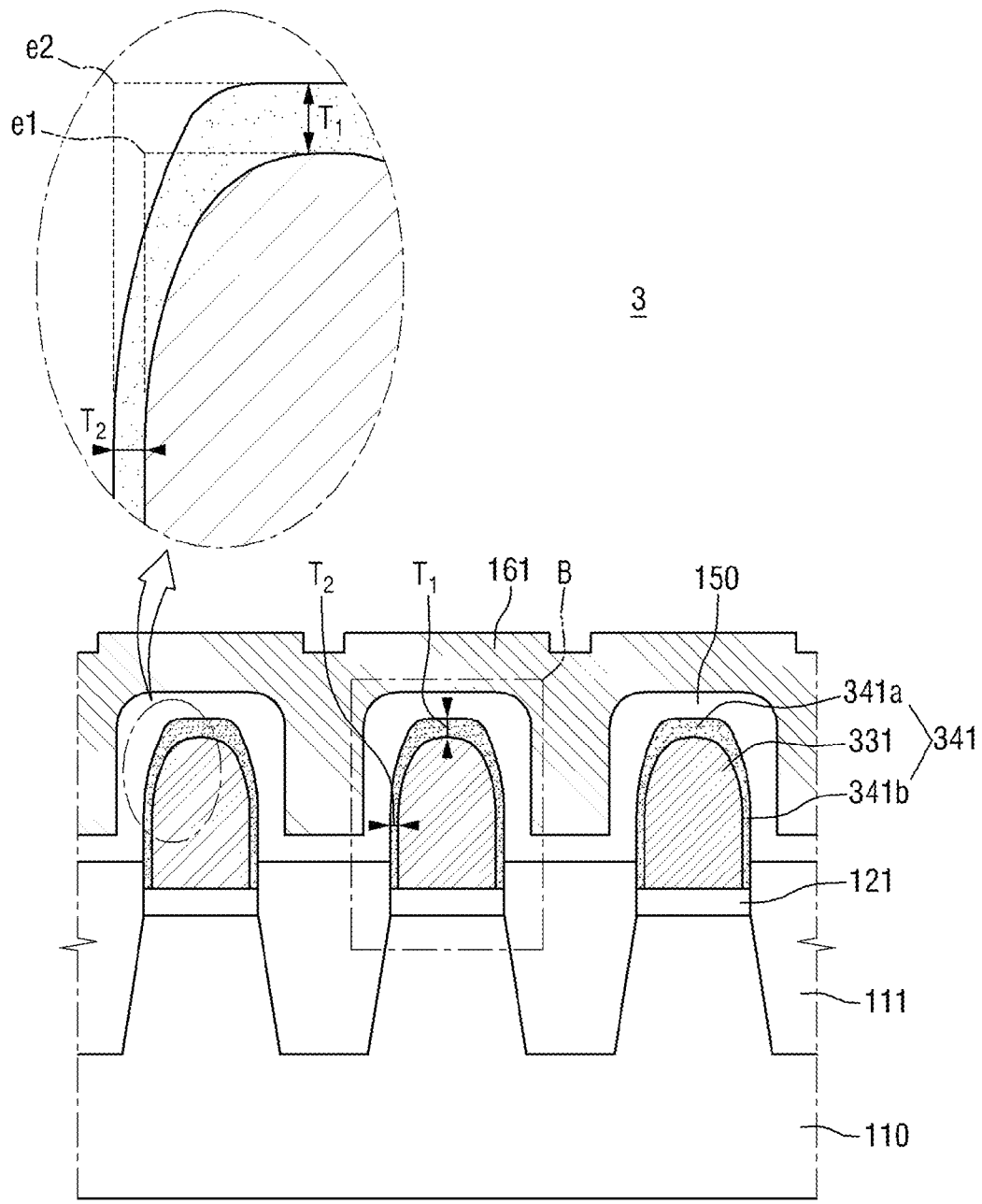

FIG. 4 is a cross-sectional view showing a nonvolatile memory device in accordance with still another example embodiment. FIG. 5 is a partial enlarged view of portion B of FIG. 4.

Referring to FIG. 4, a nonvolatile memory device 3 of the present example embodiment is different from the nonvolatile memory device 1 of the above-described example embodiment in that an edge of a floating gate 331 is rounded, and an edge of a lower barrier layer 341 is also rounded along a profile of the floating gate 331. The following description will be made focusing on substantial differences from the nonvolatile memory device 1.

The floating gate 331 is formed on the tunneling insulating layer 121 along the sidewall of the device isolation layer 111. The floating gate 331 of the present example embodiment includes an edge e1 having a rounded shape where the side and upper surfaces meet each other. In a case where the edge e1 is rounded, it is possible to mitigate the electric field concentrated on the edge of the floating gate. However, in this case, referring to FIG. 5, the electric field is not concentrated on the edge, whereas the electric field concentration on the upper surface of the floating gate 331 may become more intense. The electric field concentration on the upper surface of the floating gate 331 may be more intense as an aspect ratio of the floating gate 331 is greater.

The lower barrier layer 341 may mitigate the electric field concentration on the upper surface of the floating gate 331, and prevent movement of dopants. The lower barrier layer 341 is formed along a profile of the floating gate 331 to surround the floating gate 331. The lower barrier layer 341 includes a first lower barrier layer 341a formed on the upper surface of the floating gate 331, and a second lower barrier layer 341b formed on the side surface of the floating gate 331. An edge e2 where the first lower barrier layer 341a and the second lower barrier layer 341b meet each other may be rounded along the edge e1 of the floating gate 331.

A thickness $T_1$ of the first lower barrier layer 341a may be larger than a thickness $T_2$ of the second lower barrier layer 341b.

Figure 5:
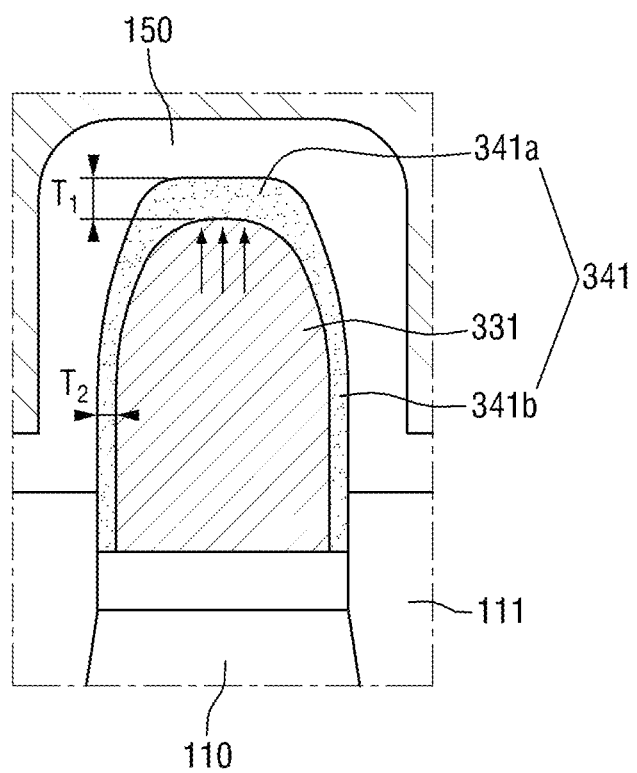
FIG. 5 is a partial enlarged view of portion B of FIG. 4.

Referring to FIG. 5, by forming the first lower barrier layer 341a to have a thickness larger than a thickness of the second lower barrier layer 341b, it is possible to mitigate the electric field concentrated on the upper surface of the floating gate 331. In this case, the thickness $T_1$ of the first lower barrier layer 341a may be more than twice larger than the thickness $T_2$ of the second lower barrier layer 341b.

Further, although not shown in the drawing, the nonvolatile memory device 3 of the present example embodiment may further include an upper barrier layer formed on the inter-gate dielectric layer 150.

Hereinafter, a nonvolatile memory device in accordance with yet still another example embodiment will be described with reference to FIG. 6.

Figure 6:
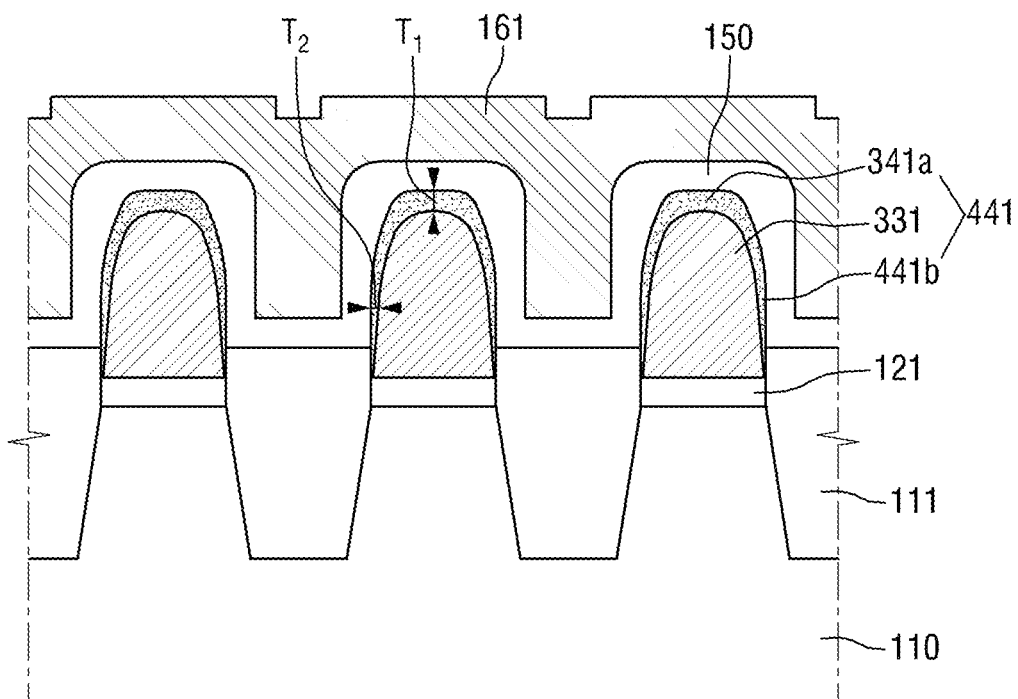
FIG. 6 is a cross-sectional view showing a nonvolatile memory device in accordance with yet still another example embodiment.

FIG. 6 is a cross-sectional view showing a nonvolatile memory device in accordance with yet still another example embodiment.

Referring to FIG. 6, a nonvolatile memory device 4 of the present example embodiment is different from the nonvolatile memory device 1 of the above-described example embodiment in that the thickness of the second lower barrier layer is non-uniform. The following description will be made focusing on substantial differences from the nonvolatile memory device 1.

A lower barrier layer 441 of the present example embodiment includes the first lower barrier layer 341a formed on the upper surface of the floating gate 331, and a second lower barrier layer 441b formed on the side surface of the floating gate 331. A thickness $T_2$ of the second lower barrier layer 441b may be smaller than the thickness $T_1$ of the first lower barrier layer 341a. Further, the thickness $T_2$ of the second lower barrier layer 441b may decrease as it goes towards the substrate 110. As described above, as the aspect ratio of the floating gate 331 increases, the electric field is concentrated on the vicinity of the upper surface of the floating gate 331 and the electric field is relatively less concentrated on the side surface. Accordingly, although the thickness of the second lower barrier layer 441b decreases as it goes towards the substrate 110, it is possible to improve reliability and operation characteristics of the device.

FIG. 6 illustrates a case of rounding the edge of the floating gate 331 and the edge where the first lower barrier layer 341a and the second lower barrier layer 441b meet each other. However, the present example embodiment is not limited thereto, and may be also applied to a case where the edge of the floating gate and the edge of the lower barrier layer are right-angled without being rounded.

Hereinafter, a nonvolatile memory device in accordance with a further example embodiment will be described with reference to FIG. 7.

Figure 7:
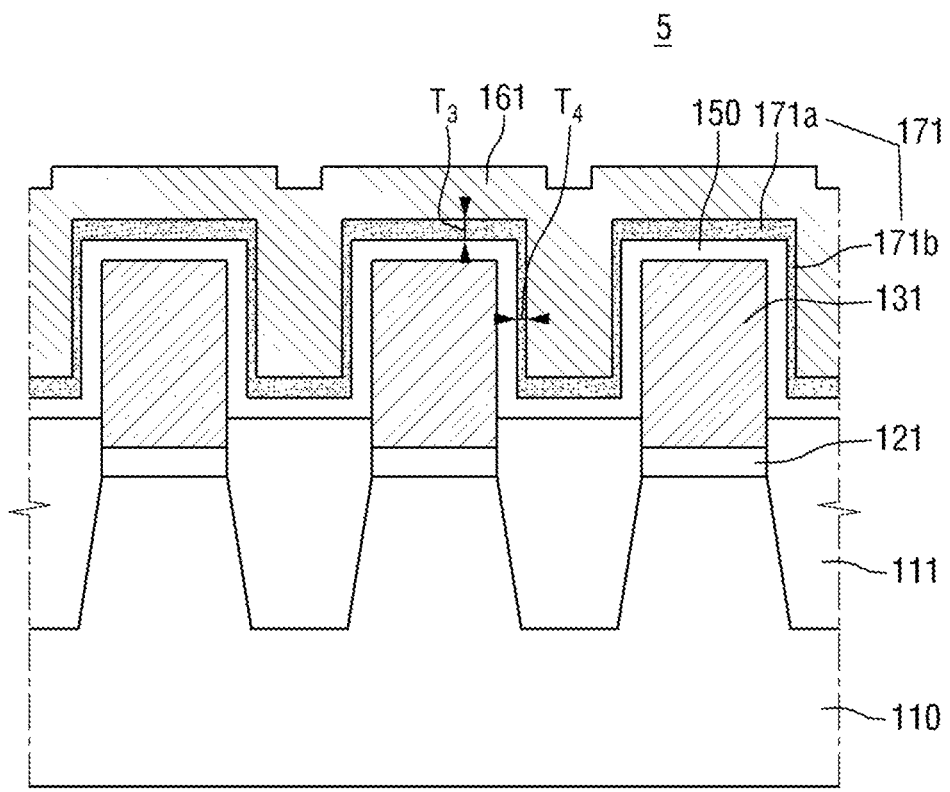
FIG. 7 is a cross-sectional view showing a nonvolatile memory device in accordance with a further example embodiment.

FIG. 7 is a cross-sectional view showing a nonvolatile memory device in accordance with a further example embodiment.

Referring to FIG. 7, a nonvolatile memory device 5 of the present example embodiment is different from the nonvolatile memory device 1 of the above-described example embodiment in that the nonvolatile memory device 5 includes only the upper barrier layer without including the lower barrier layer. The following description will be made focusing on substantial differences from the nonvolatile memory device 1.

As shown in FIG. 7, the nonvolatile memory device 5 of the present example embodiment includes the upper barrier layer 171. The upper barrier layer 171 includes the first upper barrier layer 171a formed on the upper surface of the inter-gate dielectric layer 150, and the second upper barrier layer 171b formed on the side surface of the inter-gate dielectric layer 150. The first upper barrier layer 171a and the second upper barrier layer 171b may be formed of silicon nitride. The thickness $T_3$ of the first upper barrier layer 171a may be larger than the thickness $T_4$ of the second upper barrier layer 171b. By forming the thickness $T_3$ of the first upper barrier layer 171a to be larger than the thickness $T_4$, it is possible to mitigate the electric field concentrated on the upper surface of the floating gate 131. Accordingly, it is possible to improve reliability and operation characteristics of the device.

Hereinafter, a nonvolatile memory device in accordance with a yet further example embodiment will be described with reference to FIGS. 8 to 12.

Figure 8:
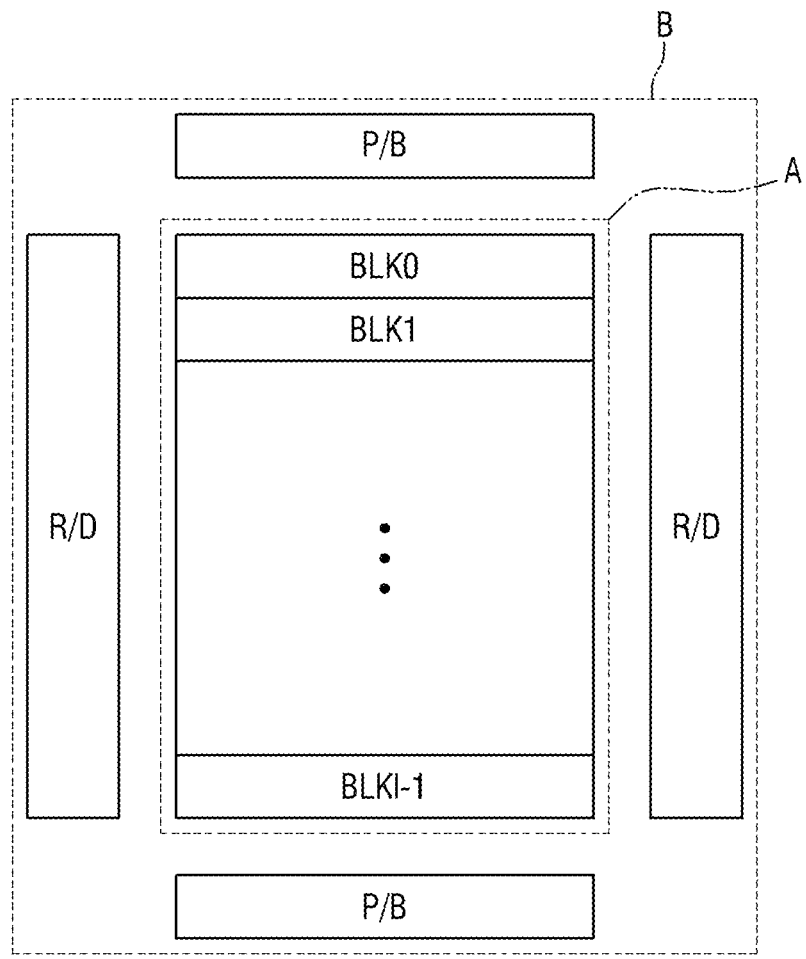
FIG. 8 is a block diagram showing a nonvolatile memory device in accordance with a yet further example embodiment.
Figure 9:
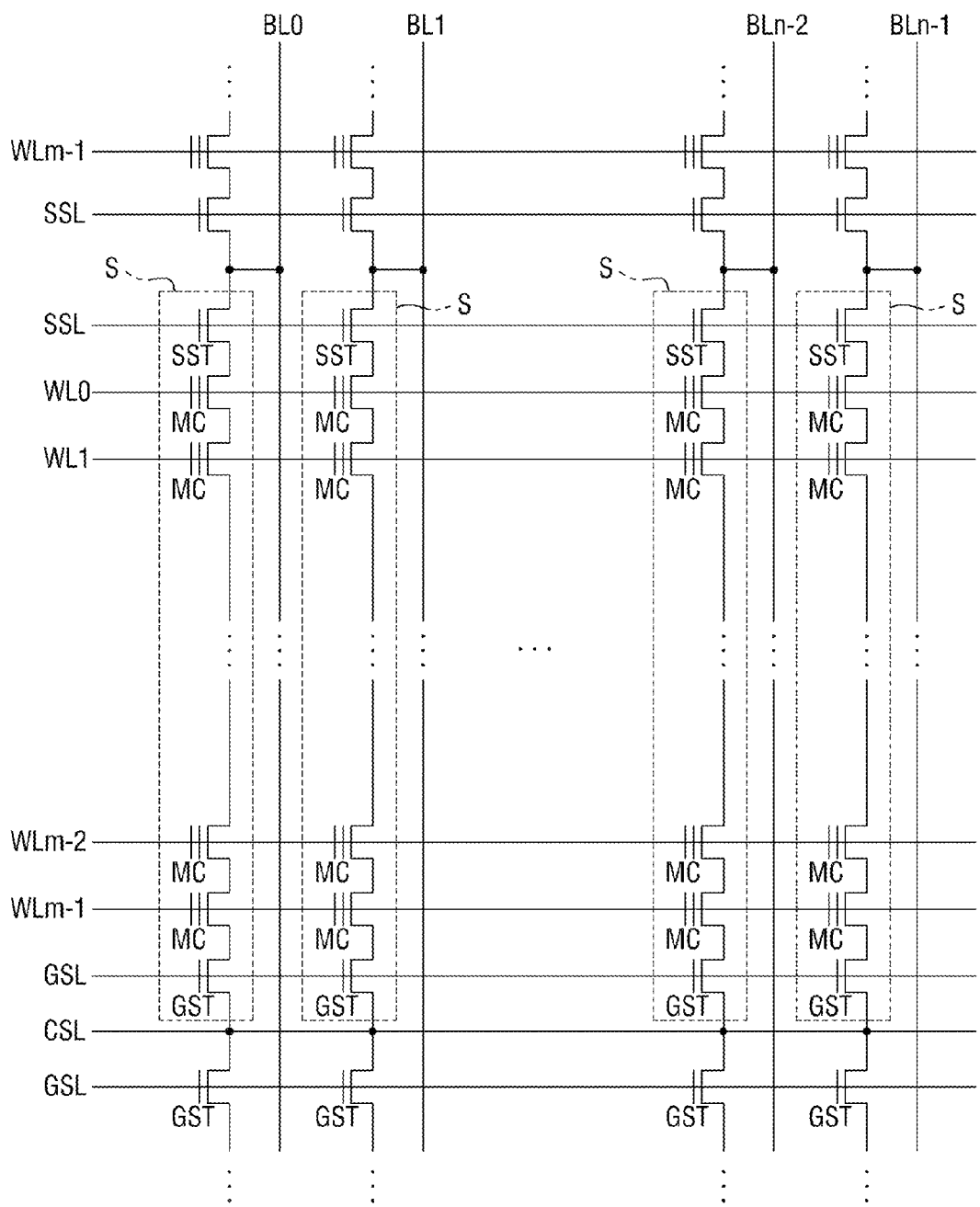
FIG. 9 is a circuit diagram of a cell array region of FIG. 8.
Figure 10:
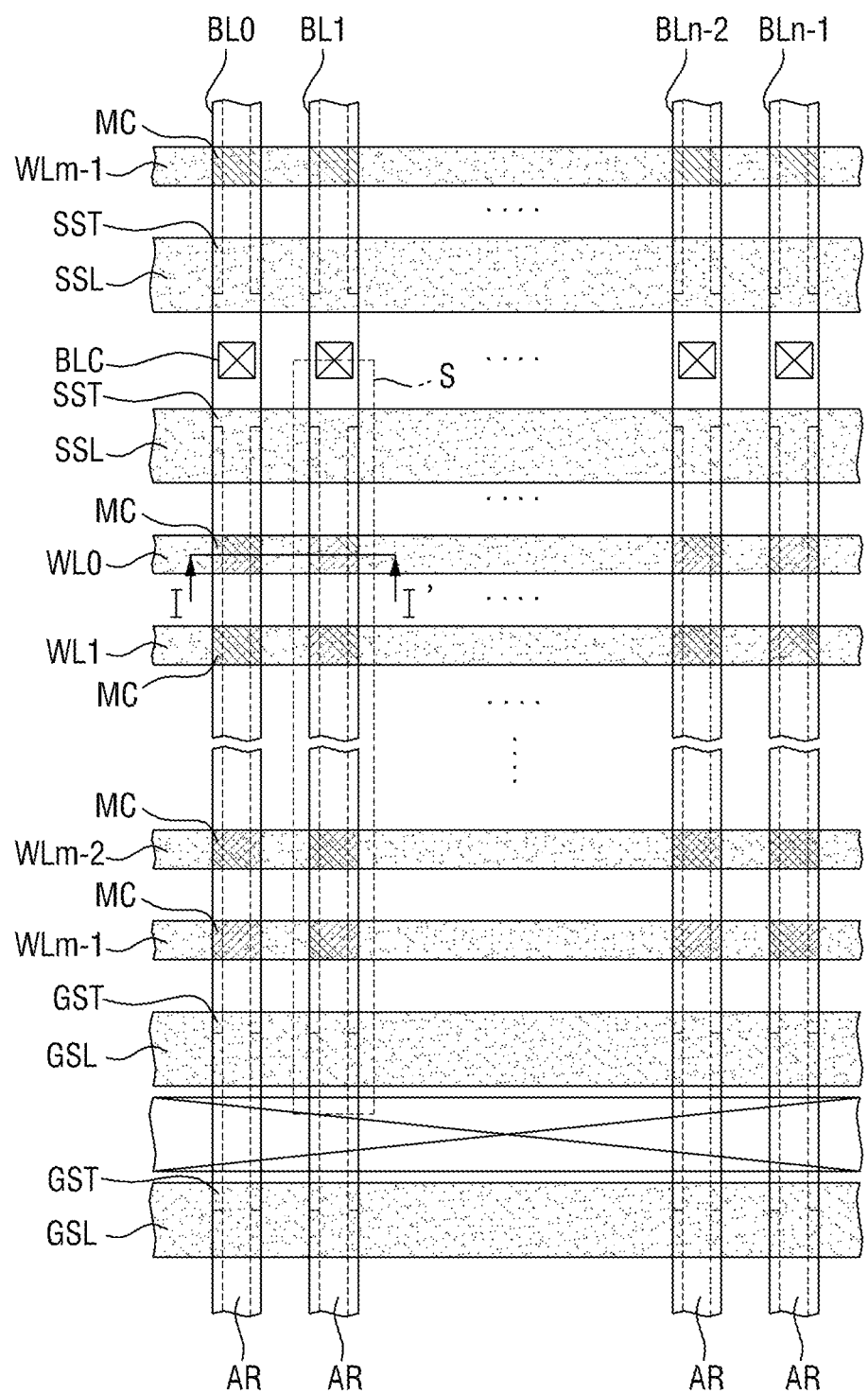
FIG. 10 is a layout diagram of the cell array region of FIG. 8.
Figure 11:
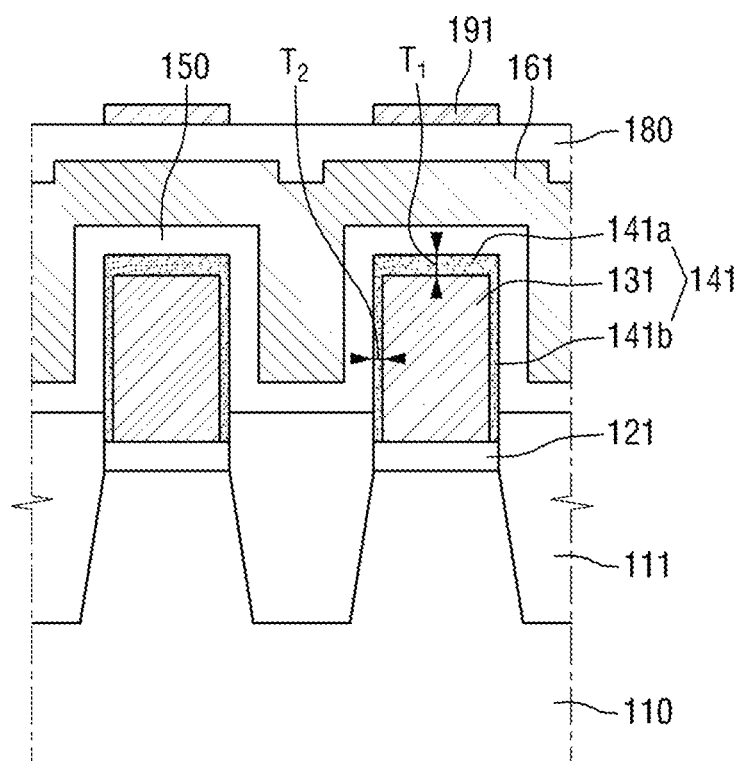
FIGS. 11 and 12 are cross-sectional views taken along line I-I' of FIG. 10.
Figure 12:
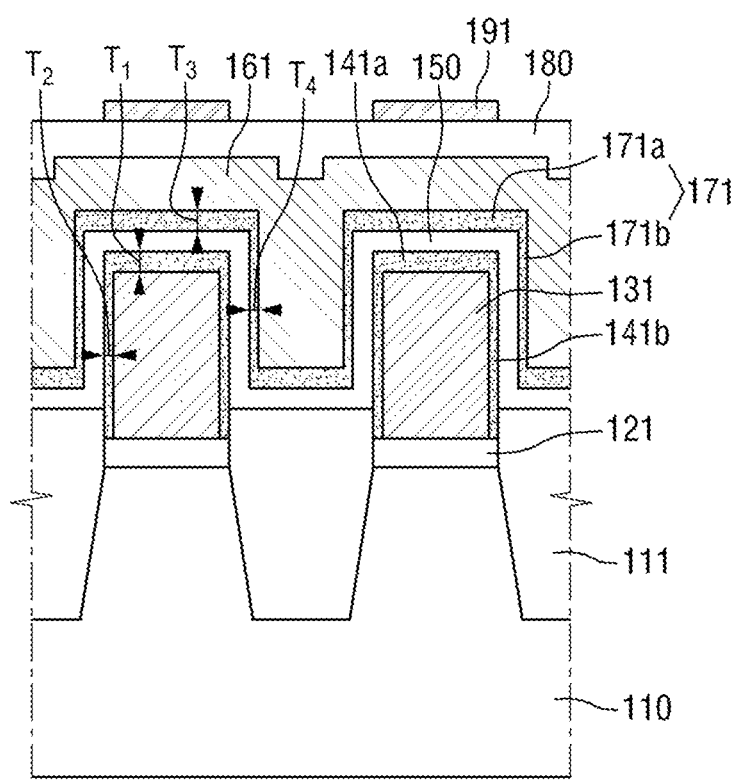

FIG. 8 is a block diagram showing a nonvolatile memory device in accordance with a yet further example embodiment. FIG. 9 is a circuit diagram of a cell array region of FIG. 8. FIG. 10 is a layout diagram of the cell array region of FIG. 8. FIGS. 11 and 12 are cross-sectional views taken along line I-I' of FIG. 10.

Referring to FIG. 8, in a nonvolatile memory device 6 of the present example embodiment, a cell array region A and a peripheral circuit region B are defined by the device isolation layer. In the cell array region A, a plurality of cell blocks BLK0 to BLK1-1 are repeatedly arranged. Page buffers P/B are arranged on the upper and lower sides of the peripheral circuit region B, and row decoders R/D and the like are arranged on the left and right sides of the peripheral circuit region B.

Referring to FIGS. 8 to 12, a plurality of active regions AR are arranged for each of the cell blocks BLK0 to BLK1-1. String selection lines SSL, ground selection lines GSL and common source lines CSL are arranged perpendicularly to the active regions AR. A plurality of word lines WL0 to WLm-1 are arranged between the string selection lines SSL and the ground selection lines GSL. Further, a plurality of bit lines BL0 to BLn-1 are arranged to intersect the word lines WL0 to WLm-1. Memory cell transistors MC are respectively defined in regions where the bit lines BL0 to BLn-1 intersect the word lines WL0 to WLm-1. String selection transistors SST and ground selection transistors GST are respectively defined in regions where the bit lines BL0 to BLn-1 intersect the string selection lines SSL and the ground selection lines GSL. One string S is formed by connecting the string selection transistor SST, a plurality of memory cell transistors MC and the ground selection transistor GST in series. The string formed for each of the cell blocks BLK0 to BLK1-1 is connected in parallel to each of the bit lines BL. That is, a drain of the string selection transistor SST of each string S is connected to the bit line BL. A source of the ground selection transistor GST is connected to the common source line CSL.

The cell array region A includes active regions defined by the device isolation layer 111. The tunneling oxide layer 121, the floating gate 131, the lower barrier layer 141, the inter-gate dielectric layer 150 and the control gate 161 may be formed on the active regions. An interlayer insulating layer 180 may be formed on the control gate 161, and bit lines 191 may be formed on the interlayer insulating layer 180. The lower barrier layer 141 includes the first lower barrier layer 141a formed on the upper surface of the floating gate 131, and the second lower barrier layer 141b formed on the side surface of the floating gate 131. The thickness $T_1$ of the first lower barrier layer 141a is larger than the thickness $T_2$ of the second lower barrier layer 141b.

Further, the nonvolatile memory device 6 of the present example embodiment may further include the upper barrier layer 171 (as shown in FIG. 12) formed on the inter-gate dielectric layer 150 as shown in FIG. 12.

Hereinafter, a method of fabricating a nonvolatile memory device in accordance with an example embodiment will be described with reference to FIGS. 13 to 16.

FIGS. 13 to 16 are cross-sectional views showing structures in intermediate steps of a method of fabricating a nonvolatile memory device in accordance with an example embodiment.

Figure 13:
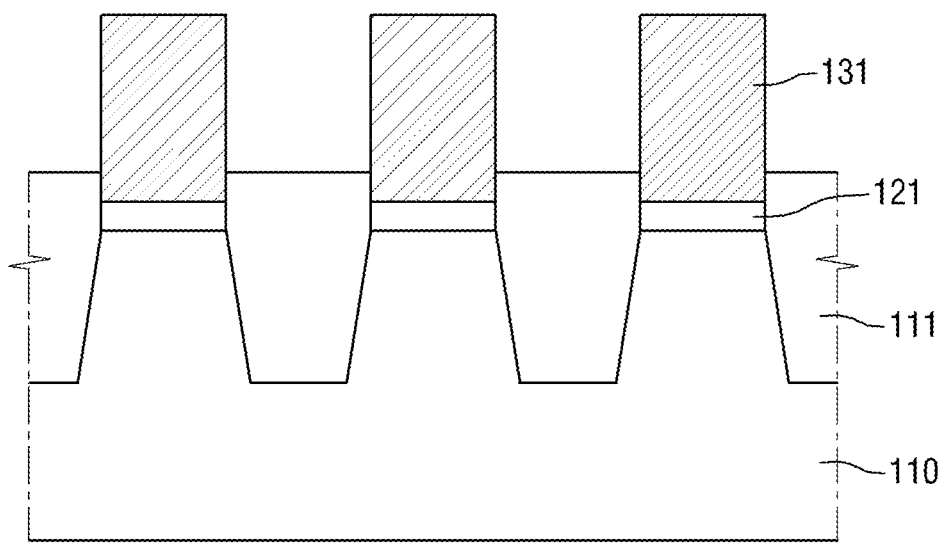
FIGS. 13 to 16 are cross-sectional views showing structures in intermediate steps of a method of fabricating a nonvolatile memory device in accordance with an example embodiment.

Referring to FIG. 13, the device isolation layer 111 defining the active regions is formed in the substrate 110. An insulating layer 121 and a polysilicon layer 131 are formed on the active regions. Specifically, a mask pattern defining a region where the device isolation layer will be formed is formed on the substrate 110. Then, an etching process is performed using the mask pattern as a mask to form a plurality of trenches in the substrate 110. Subsequently, a device isolation layer pattern is formed to fill up the trenches and empty areas in the mask pattern, and the device isolation layer 111 is formed by removing the mask pattern. After forming the device isolation layer 111, the height of the device isolation layer 111 may be adjusted using an etching process (e.g., etch back, chemical mechanical polishing or the like). Subsequently, an insulating material and polysilicon may be sequentially deposited on the substrate 110 using an oxidation process or a method such as chemical vapor deposition (CVD), plasma enhanced chemical vapor deposition (PECVD), physical vapor deposition (PVD), atomic layer deposition (ALD) and the like, and patterned to form the insulating layer 121 and the polysilicon layer 131. In this case, the polysilicon layer 131 may be doped with impurities. In this case, the insulating layer 121 may be a tunneling oxide layer, and the polysilicon layer 131 may be the floating gate 131.

Further, although not shown in the drawing, the device isolation layer 111, the insulating layer 121 and the polysilicon layer 131 may be formed by the following process. After an insulating material for an insulating layer and polysilicon are sequentially deposited on the substrate 110, etching is performed using a mask pattern defining a region where the device isolation layer will be formed to thereby form a plurality of trenches. Consequently, the insulating layer 121 and the polysilicon layer 131 are formed, and then, an oxide layer is formed on the entire surface of the substrate 110 to cover the insulating layer 121 and the polysilicon layer 131 and fill up the trenches. Then, the oxide layer is polished using a method such as chemical mechanical polishing or the like, thereby completing the device isolation layer 111 while exposing the polysilicon layer 131.

Figure 14:
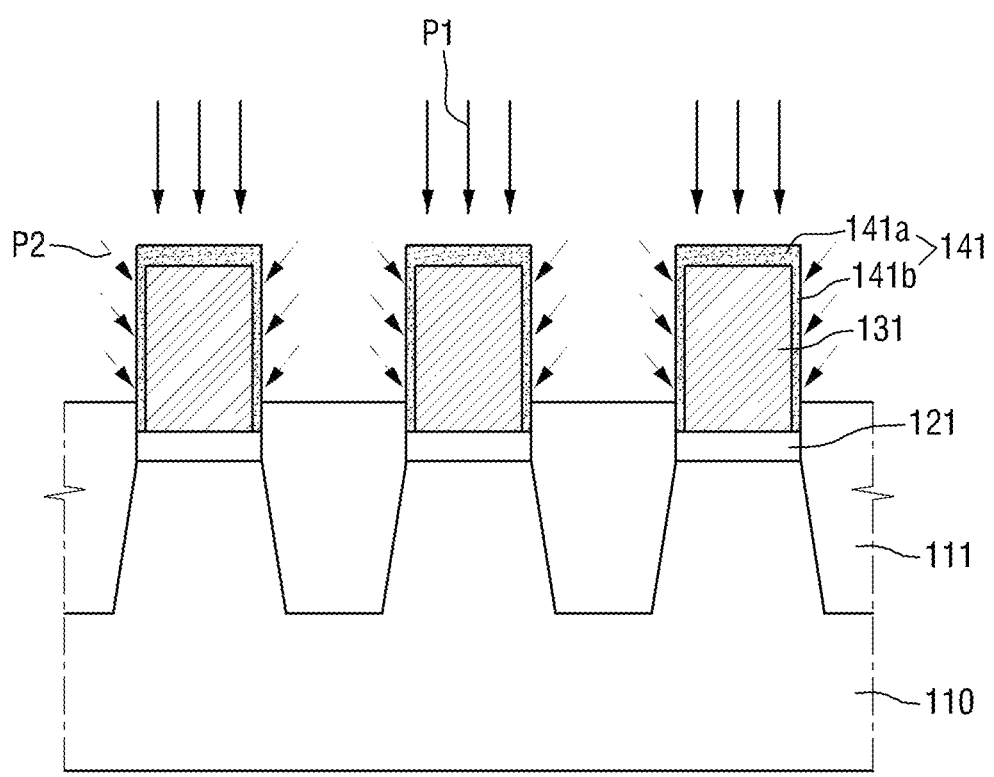

Referring to FIG. 14, a lower nitride layer 141 is formed to surround the polysilicon layer 131. The lower nitride layer 141 includes a first lower nitride layer 141a formed on the upper surface of the polysilicon layer 131, and a second lower nitride layer 141b formed on the side surfaces of the polysilicon layer 131. Specifically, a nitrogen source gas is injected, and a plasma nitridation process is performed to form the lower nitride layer 141 surrounding the polysilicon layer 131. A part of the floating gate 131 is nitridated by plasma nitridation to form the lower nitride layer 141. The plasma nitridation process may be performed for about 30 seconds to about 250 seconds at a temperature of about 300° C. to about 700° C., and a pressure of about 0.1 ton to about 3.0 torr. In this case, if a bias voltage of about 100 V to about 500 V is applied to the substrate 110, plasma nitridation P1 may occur more readily on the upper surface of the polysilicon layer 131 than plasma nitridation P2 occurring on the side surfaces of the polysilicon layer 131. Accordingly, the thickness of the first lower nitride layer 141a becomes larger than the thickness of the second lower nitride layer 141b. That is, the first lower nitride layer 141a may be formed to have a thickness larger than a thickness of the second lower nitride layer 141b by using a bias plasma nitridation method.

Figure 15:
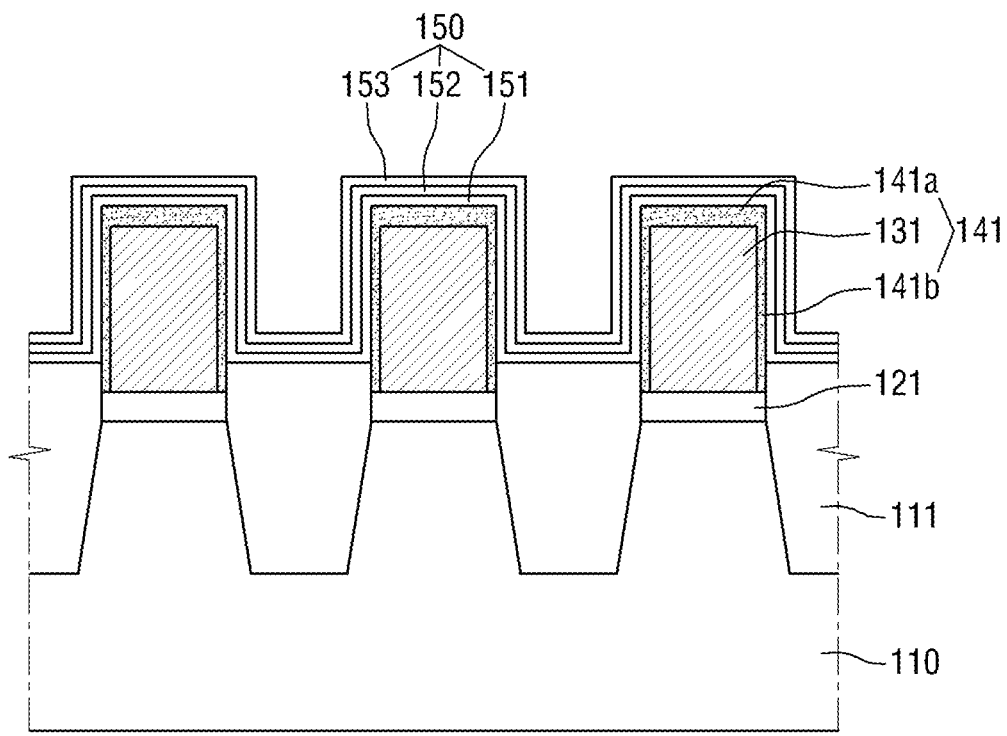

Referring to FIG. 15, a dielectric layer structure 150 including a first oxide layer 151, a nitride layer 152 and a second oxide layer 153 that are sequentially stacked on the lower nitride layer 141 and the device isolation layer 111. Specifically, a first oxide, a nitride and a second oxide are sequentially deposited on the entire surface of the substrate 110 using a method such as chemical vapor deposition, plasma enhanced chemical vapor deposition, physical vapor deposition, atomic layer deposition and the like, thereby forming the dielectric layer structure 150 including the first oxide layer 151, the nitride layer 152 and the second oxide layer 153. The dielectric layer structure 150 includes an upper surface formed along a profile of the upper surface of the floating gate 131 and the upper surface of the device isolation layer 111, and side surfaces formed along a profile of the side surfaces of the floating gate 131. FIG. 15 illustrates a case where the dielectric layer structure 150 includes a first silicon oxide layer 151, a silicon nitride layer 152, and a second silicon oxide layer 153 which are sequentially stacked.

Figure 16:
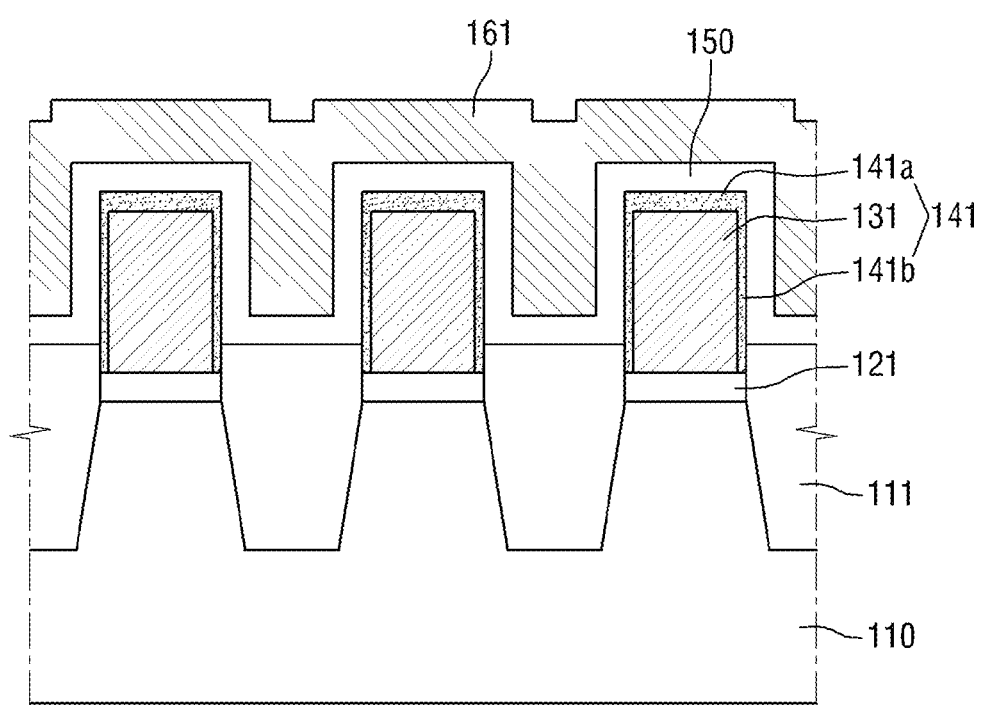

Referring to FIG. 16, a conductive layer 161 is formed on the dielectric layer structure 150. Specifically, a conductive material is deposited on the dielectric layer structure 150 using a method such as CVD, PECVD, PVD, ALD and the like to form the conductive layer 161. The conductive layer 161 may be, e.g., a control gate.

Hereinafter, a method of fabricating a nonvolatile memory device in accordance with another example embodiment will be described with reference to FIG. 17.

Figure 17:
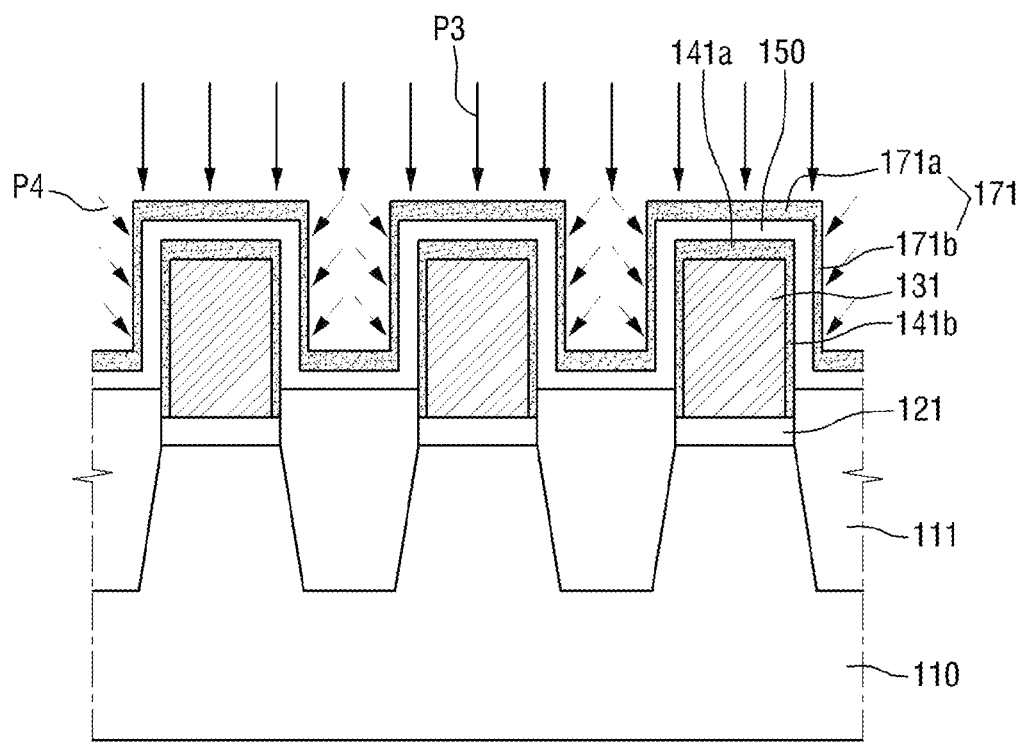
FIG. 17 is a cross-sectional view showing a structure in an intermediate step of a method of fabricating a nonvolatile memory device in accordance with another example embodiment.

FIG. 17 is a cross-sectional view showing a structure in an intermediate step of a method of fabricating a nonvolatile memory device in accordance with another example embodiment.

The fabricating method of the present example embodiment is different from the fabricating method of the above-described example embodiment in that the method of the present example embodiment further includes the step shown in FIG. 17. The following description will be made focusing on differences.

Referring to FIG. 17, a plasma nitridation process is performed on the dielectric layer structure 150 to form an upper nitride layer 171 on the dielectric layer structure 150. Specifically, a nitrogen source gas is injected and a part of the second oxide layer 153 (shown in FIG. 15) positioned at the uppermost portion of the dielectric layer structure 150 is nitridated by a plasma process to thereby form the upper barrier layer 171 made of silicon nitride. The upper barrier layer 171 includes the first upper barrier layer 171a formed on the upper surface of the dielectric layer structure 150, and the second upper barrier layer 171b formed on the side surface of the dielectric layer structure 150. The plasma nitridation process is performed by using a bias plasma nitridation process in which a bias is applied to the substrate 110. By using the bias plasma nitridation process, nitridation P3 occurs more readily on the upper surface of the dielectric layer structure 150 than nitridation P4 occurring on the side surface of the dielectric layer structure 150. Accordingly, the first upper barrier layer 171a is formed to have a thickness larger than a thickness of the second upper barrier layer 171b.

As described above, in the method of fabricating a nonvolatile memory device in accordance with the example embodiments, the nitride layer formed on the upper surface of the polysilicon layer or the upper surface of the conductive layer has a thickness larger than a thickness of the nitride layer formed on the side surfaces thereof. Accordingly, it is possible to mitigate the electric field concentration on the upper portion of the polysilicon layer and prevent diffusion of impurities and the like, thereby improving reliability and operation characteristics of the device.

Hereinafter, a memory system in accordance with an example embodiment and application examples thereof will be described with reference to FIGS. 18 to 20.

Figure 18:
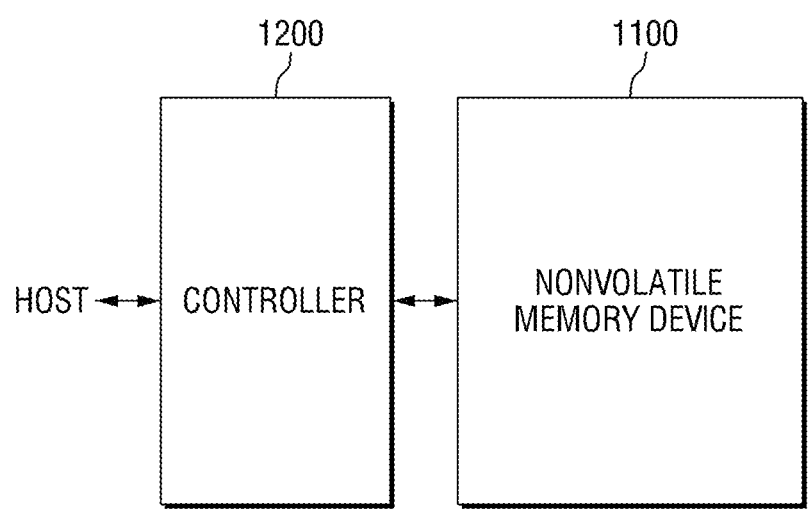
FIG. 18 is a block diagram for explaining a memory system in accordance with an example embodiment.

FIG. 18 is a block diagram for explaining a memory system in accordance with an example embodiment. FIG. 19 is a block diagram showing an application example of the memory system of FIG. 18. FIG. 20 is a block diagram showing a computing system including the memory system described with reference to FIG. 19.

Referring to FIG. 18, a memory system 1000 includes a nonvolatile memory device 1100 and a controller 1200.

The nonvolatile memory device 1100 may have the configuration and operation described with reference to FIGS. 1 to 12.

The controller 1200 is connected to a host and the nonvolatile memory device 1100. In response to the request of the host, the controller 1200 is configured to access the nonvolatile memory device 1100. For example, the controller 1200 is configured to control read, write, erase and background operations of the nonvolatile memory device 1100. The controller 1200 is configured to provide an interface between the nonvolatile memory device 1100 and the host. The controller 1200 is configured to operate a firmware for controlling the nonvolatile memory device 1100.

Illustratively, the controller 1200 may further include well-known components (e.g., a random access memory (RAM), a processing unit, a host interface, and a memory interface). The RAM is used as at least one of an operation memory of the processing unit, a cache memory between the nonvolatile memory device 1100 and the host, a buffer memory between the nonvolatile memory device 1100 and the host. The processing unit controls all operations of the controller 1200.

The host interface includes a protocol for performing data exchange between the host and the controller 1200. For example, the controller 1200 is configured to perform communication with the outside (host) through at least one of various interface protocols (e.g., a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol). The memory interface interfaces with the nonvolatile memory device 1100. For example, the memory interface includes a NAND interface or NOR interface.

The memory system 1000 may be configured to additionally include an error correction block. The error correction block is configured to detect and correct an error of data read from the nonvolatile memory device 1100 using an error correction code (ECC). As an example, the error correction block is provided as a component of the controller 1200. The error correction block may be provided as a component of the nonvolatile memory device 1100.

The controller 1200 and the nonvolatile memory device 1100 may be integrated as one semiconductor device. Illustratively, the controller 1200 and the nonvolatile memory device 1100 may be integrated as one semiconductor device to constitute a memory card. For example, the controller 1200 and the nonvolatile memory device 1100 may be integrated as one semiconductor device to constitute a memory card (e.g., a PC card (personal computer) memory card international association (PCMCIA), a compact flash card (CF), a smart media card (SM, SMC), a memory stick, a multimedia card (MMC, RS-MMC, MMCmicro), a SD card (SD, miniSD, microSD, SDHC), a universal flash storage device (UFS) and the like).

The controller 1200 and the nonvolatile memory device 1100 may be integrated as one semiconductor device to constitute a semiconductor drive (solid state drive (SSD)). The semiconductor drive (SSD) includes a storage device configured to store data in a semiconductor memory. In a case where the memory system 1000 is used as the semiconductor drive (SSD), an operation speed of the host connected to the memory system 1000 is dramatically improved.

As another example, the memory system 1000 is provided as one of various components of an electronic apparatus (e.g., a computer, ultra mobile PC (UMPC), workstation, net-book, personal digital assistants (PDA), portable computer, web tablet, wireless phone, mobile phone, smart phone, e-book, portable multimedia player (PMP), portable game console, navigation device, black box, digital camera, 3-dimensional television, digital audio recorder, digital audio player, digital picture recorder, digital picture player, digital video recorder, digital video player, or an apparatus capable of transmitting and receiving information in wireless environment), one of various electronic apparatuses constituting the home network, one of various electronic apparatuses constituting the computer network, one of various electronic apparatuses constituting the telematics network, RFID device, or one of various components forming the computing system.

Illustratively, the nonvolatile memory device 1100 or the memory system 1000 may be mounted as various types of packages. For example, the nonvolatile memory device 1100 or the memory system 1000 may be mounted as a package such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), small outline (SOIC), a shrink small outline package (SSOP), a thin small outline (TSOP), a thin quad flat pack (TQFP), system in package (SIP), a multi chip package (MCP), a wafer-level fabricated package (WFP), a wafer-level processed stack package (WSP).

Figure 19:
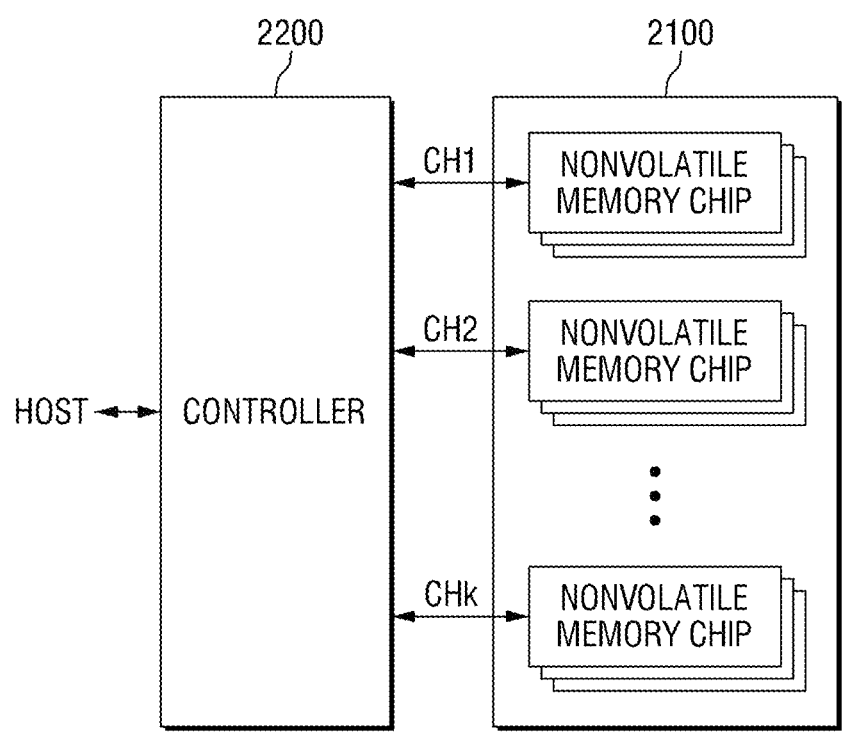
FIG. 19 is a block diagram showing an application example of the memory system of FIG. 18.

Referring to FIG. 19, a memory system 2000 includes a nonvolatile memory device 2100 and a controller 2200. The nonvolatile memory device 2100 includes a plurality of nonvolatile memory chips. The nonvolatile memory chips are classified into a plurality of groups. Each group of the nonvolatile memory chips is configured to perform communication with the controller 2200 via one common channel. For example, as illustrated in FIG. 19, the nonvolatile memory chips perform communication with the controller 2200 via first through k channels CH1 to CHk.

A case where a plurality of nonvolatile memory chips are connected to one channel has been illustrated in FIG. 19. However, it can be understood that the memory system 2000 may be modified such that one nonvolatile memory chip is connected to one channel.

Figure 20:
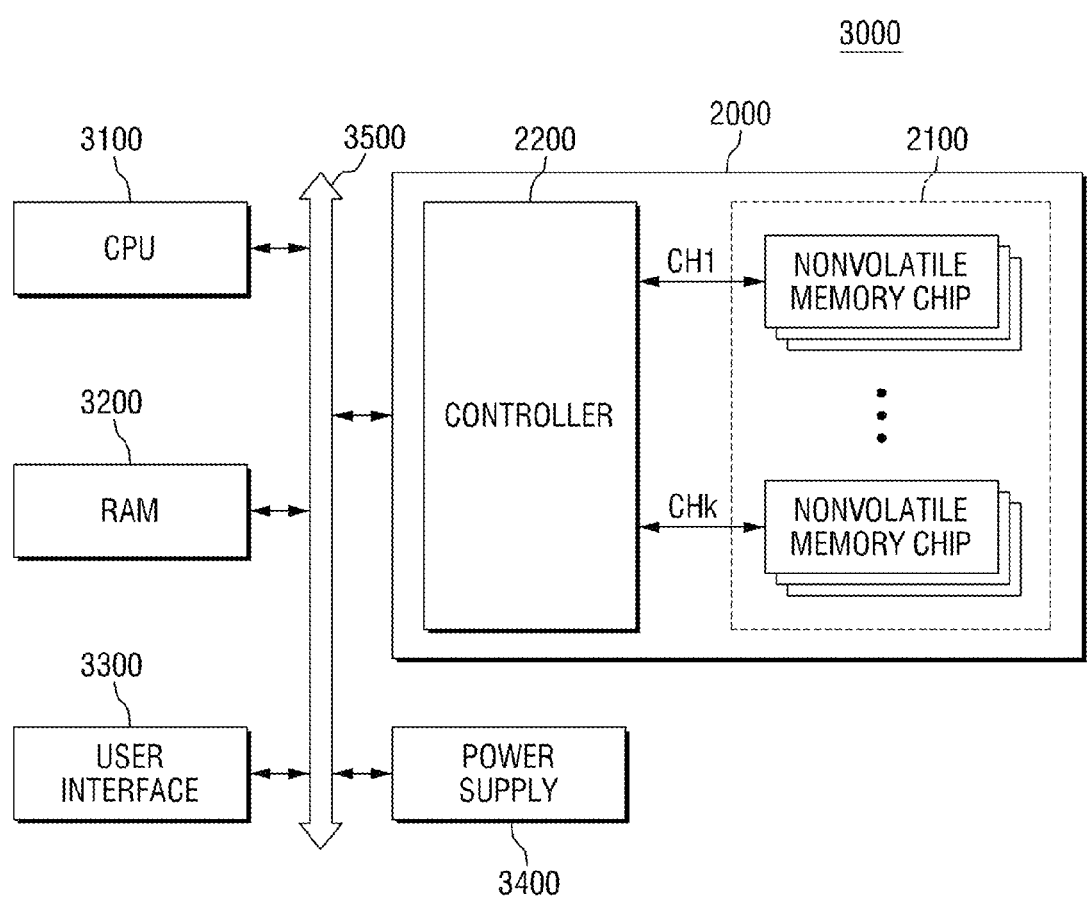
FIG. 20 is a block diagram showing a computing system including the memory system described with reference to FIG. 19.

Referring to FIG. 20, a computing system 3000 includes a central processing unit 3100, a random access memory (RAM) 3200, a user interface 3300, a power supply 3400, and the memory system 2000.

The memory system 2000 is electrically connected to the central processing unit 3100, the RAM 3200, the user interface 3300 and the power supply 3400 via a system bus 3500. The data provided through the user interface 3300 or processed by the central processing unit 3100 are stored in the memory system 2000.

FIG. 20 illustrates a case where the nonvolatile memory device 2100 is connected to the system bus 3500 through the controller 2200. However, the nonvolatile memory device 2100 may be configured to be directly connected to the system bus 3500.

A case of providing the memory system 2000 described with reference to FIG. 19 has been illustrated in FIG. 20. However, the memory system 2000 may be replaced by the memory system 1000 described with reference to FIG. 18.

As an example, the computing system 3000 may be configured to include all of the memory systems 1000 and 2000 described with reference to FIGS. 18 and 19.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A nonvolatile memory device, comprising:
a floating gate over a substrate;
a lower barrier layer including a first lower barrier layer on an upper surface of the floating gate, and a second lower barrier layer on a side surface of the floating gate, the second lower barrier layer having a thickness smaller than a thickness of the first lower barrier layer;
an inter-gate dielectric layer over the lower barrier layer; and
a control gate over the inter-gate dielectric layer.

2. The nonvolatile memory device of claim 1, wherein the upper surface of the floating gate and the side surface of the floating gate are in contact with each other at a rounded edge.

3. The nonvolatile memory device of claim 2, wherein,
the first lower barrier layer and the second lower barrier layer are in contact with each other at an edge of the lower barrier layer; and
the edge of the lower barrier layer is rounded along a profile of the floating gate.

4. The nonvolatile memory device of claim 1, wherein the inter-gate dielectric layer includes an upper surface and a side surface formed along a profile of the floating gate.

5. The nonvolatile memory device of claim 4, further comprising:
an upper barrier layer including a first upper barrier layer on the upper surface of the inter-gate dielectric layer, and a second upper barrier layer on the side surface of the inter-gate dielectric layer,
a thickness of the first upper barrier layer being larger than a thickness of the second upper barrier layer.

6. The nonvolatile memory device of claim 5, wherein the upper barrier layer includes silicon nitride.

7. The nonvolatile memory device of claim 4, wherein the inter-gate dielectric layer includes a first oxide layer, a nitride layer and a second oxide layer sequentially stacked.

8. The nonvolatile memory device of claim 7, further comprising:
a tunneling insulating layer below the floating gate.

9. The nonvolatile memory device of claim 1, wherein the lower barrier layer includes silicon nitride.

10. The nonvolatile memory device of claim 9, wherein the lower barrier layer surrounds the floating gate.

11. The nonvolatile memory device of claim 1, wherein a thickness of the second lower barrier layer decreases towards the substrate.

12. The nonvolatile memory device of claim 1, wherein,
the substrate includes active regions defined by an device isolation layer, and
the floating gate and the lower barrier layer are over the active regions.

13. A nonvolatile memory device, comprising:
a floating gate over a substrate;
an inter-gate dielectric layer over the floating gate and along a profile of the floating gate;
an upper barrier layer including a first upper barrier layer on an upper surface of the inter-gate dielectric, and a second upper barrier layer on a side surface of the inter-gate dielectric, the second upper barrier layer having a thickness smaller than a thickness of the first upper barrier layer; and
a control gate over the upper barrier layer.

14. The nonvolatile memory device of claim 13, wherein the upper barrier layer is formed of silicon nitride.

15. The nonvolatile memory device of claim 14, wherein the upper barrier layer is formed of implanted nitrogen ions.

16. A nonvolatile memory device, comprising:
a floating gate over a substrate;
a first diffusion prevention layer formed along a profile of the floating gate, the first diffusion prevention layer formed along side surfaces of the floating gate being thinner than the first diffusion prevention layer formed along an upper surface of the floating gate;
an inter-gate dielectric layer over the floating gate; and
a control gate over the inter-gate dielectric layer.

17. The nonvolatile memory device of claim 16, wherein the first diffusion prevention layer is interposed between the floating gate and the inter-gate dielectric layer or between the inter-gate dielectric layer and the control gate.

18. The nonvolatile memory device of claim 17, further comprising:
a second diffusion prevention layer interposed between the control gate and the inter-gate dielectric layer,
the second diffusion prevention layer being formed along the profile of the floating gate such that the second diffusion prevention layer formed along the side surfaces of the floating gate are thinner than the second diffusion prevention layer formed along the upper surface of the floating gate, and
the first diffusion prevention layer being interposed between the floating gate and the inter-gate dielectric layer.

19. The nonvolatile memory device of claim 16, wherein the first diffusion prevention layer formed along the side surfaces of the floating gate is tapered.

20. The nonvolatile memory device of claim 16, wherein edges of the upper surface of the floating gate and edges of an upper surface of the first diffusion prevention layer are rounded.

* * * * *